(12) United States Patent
Tapias et al.

(10) Patent No.: US 10,930,499 B2
(45) Date of Patent: Feb. 23, 2021

(54) SEMICONDUCTOR STRUCTURE FORMATION

(71) Applicant: Micron Technology, Inc., Boise, ID (US)

(72) Inventors: Nicholas R. Tapias, Boise, ID (US); Sanjeev Sapra, Boise, ID (US); Anish A. Khandekar, Boise, ID (US); Shen Hu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/379,085

(22) Filed: Apr. 9, 2019

(65) Prior Publication Data

US 2020/0328080 A1   Oct. 15, 2020

(51) Int. Cl.
*H01L 21/02* (2006.01)
*H01L 21/762* (2006.01)
*H01L 21/8238* (2006.01)

(52) U.S. Cl.
CPC .. *H01L 21/02636* (2013.01); *H01L 21/02381* (2013.01); *H01L 21/02428* (2013.01); *H01L 21/02532* (2013.01); *H01L 21/02592* (2013.01); *H01L 21/76224* (2013.01); *H01L 21/823821* (2013.01)

(58) Field of Classification Search
CPC ......... H01L 21/02636; H01L 21/02381; H01L 21/02428; H01L 21/02532; H01L 21/02592; H01L 21/76224; H01L 21/823821

USPC ............... 257/63, 64, 65; 438/149, 150, 151
See application file for complete search history.

(56) References Cited

U.S. PATENT DOCUMENTS

| | | | |
|---|---|---|---|
| 7,662,693 B2 | 2/2010 | Bhattacharyya | |
| 7,875,529 B2 | 1/2011 | Forbes et al. | |
| 8,274,777 B2 | 9/2012 | Kiehlbauch | |
| 10,176,997 B1 * | 1/2019 | De Silva et al. | ........................... H01L 21/281123 |
| 2018/0096898 A1 * | 4/2018 | Yu et al. | ......... H01L 21/823821 |

* cited by examiner

*Primary Examiner* — Thinh T Nguyen
(74) *Attorney, Agent, or Firm* — Brooks, Cameron & Huebsch, PLLC

(57) ABSTRACT

Methods, apparatuses, and systems related to semiconductor structure formation are described. An example method includes forming an opening through silicon (Si) material, formed over a semiconductor substrate, to a first depth to form pillars of Si material. The example method further includes depositing an isolation material within the opening to fill the opening between the Si pillars. The example method further includes removing a portion of the isolation material from between the pillars to a second depth to create a second opening between the pillars and defining inner sidewalls between the pillars. The example method further includes depositing an enhancer material over a top surface of the pillars and along the inner sidewalls of the pillars down to a top portion of the isolation material.

9 Claims, 7 Drawing Sheets

SEMICONDUCTOR STRUCTURE FORMATION

TECHNICAL FIELD

The present disclosure relates generally to semiconductor devices and methods, and more particularly to formation of a semiconductor structure.

BACKGROUND

Memory devices are typically provided as internal, semiconductor, integrated circuits in computers or other electronic devices. There are many different types of memory, including random-access memory (RAM), read only memory (ROM), dynamic random-access memory (DRAM), static random access memory (SRAM), synchronous dynamic random access memory (SDRAM), ferroelectric random access memory (FeRAM), magnetic random access memory (MRAM), resistive random access memory (ReRAM), and flash memory, among others. Some types of memory devices may be non-volatile memory (e.g., ReRAM) and may be used for a wide range of electronic applications in need of high memory densities, high reliability, and low power consumption. Volatile memory cells (e.g., DRAM cells) require power to retain their stored data state (e.g., via a refresh process), as opposed to non-volatile memory cells (e.g., flash memory cells), which retain their stored state in the absence of power. However, various volatile memory cells, such as DRAM cells may be operated (e.g., programmed, read, erased, etc.) faster than various non-volatile memory cells, such as flash memory cells.

DETAILED DESCRIPTION

Figure 2:
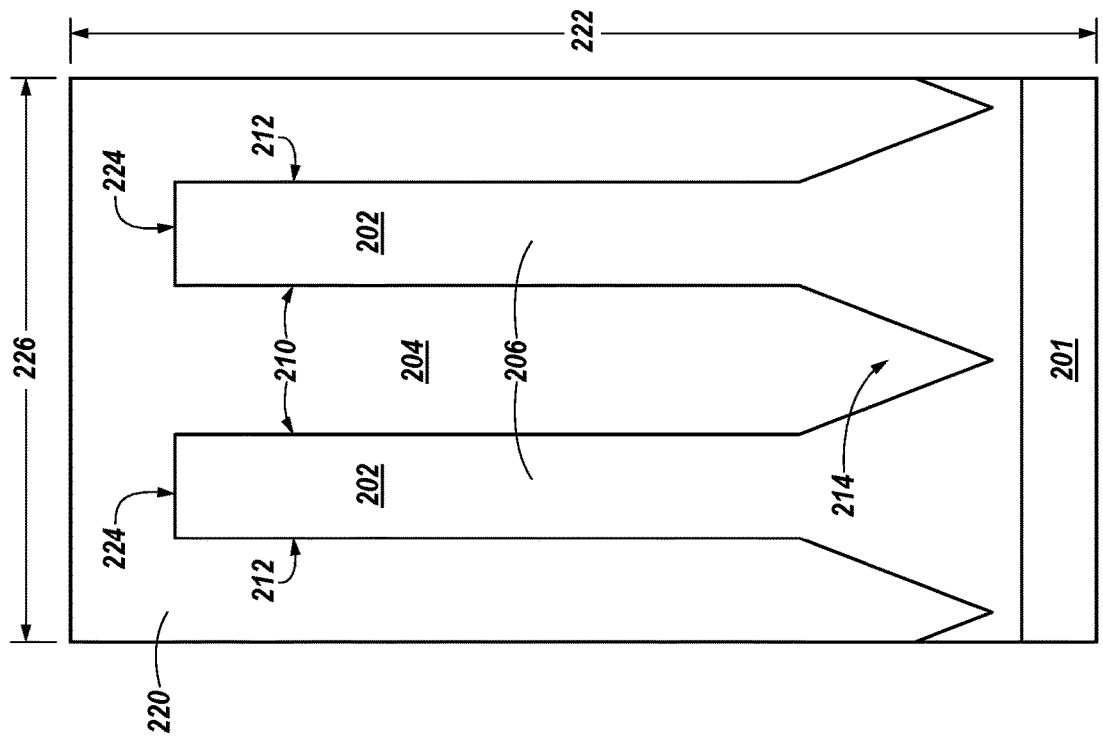
FIGS. 1-6 each illustrate a cross-sectional view of a semiconductor structure during an example fabrication sequence for formation of a semiconductor structure in accordance with a number of embodiments of the present disclosure

Various types of semiconductor structures on memory devices (e.g., those that include volatile or non-volatile memory cells) may include rectilinear trenches and/or round, square, oblong, etc., cavities that may be formed into semiconductor material to create openings thereon for subsequent semiconductor processing steps. Various materials may be deposited using chemical vapor deposition (CVD), plasma deposition, etc. and patterned using photolithographic techniques, doped and etched using vapor, wet and/or dry etch processes to form semiconductor structures on a substrate. Such openings may contain, or be associated with, various materials that contribute to data access, storage, and/or processing, or to various support structures, on the memory device.

In one example process, an opening may be formed through silicon material on a semiconductor substrate to form pillars. The pillars may be used to form active areas to discrete semiconductor device regions, e.g., source regions, drain regions, channel regions, etc., and undergo subsequent processing steps to form a discrete devices such as transistors, e.g., such as a buried recess access device (BRAD), to a dynamic random access memory (DRAM) cell. Embodiments are not limited to this example.

As design rules scale to smaller dimensions, deeper openings or trenches with more narrow widths may be utilized for isolation purposes and for enhancing the speed of the device. In addition to forming deeper trenches, an increased active area for discrete device regions may also be desired. In previous approaches selective epitaxial growth has been used over silicon. However, selective epitaxial growth has preferential orientations and terminates on slow growth planes that prevent it from being used in narrow pattern devices. In addition, the surface migration induced from annealing selective epitaxial structures to reshape them causes abnormalities and has poor shape control.

In contrast, example embodiments of the present disclosure utilize an amorphous starting film, e.g., an enhancer layer, deposited over silicon to enlarge active areas. Utilizing an amorphous starting film, e.g., enhancer layer, overcomes the limitations to using selective epitaxial growth because the enhancer layer can be grown ex-situ using solid phase epitaxy that will expand discrete device active area, uniformly and conformally. As a result, improved discrete device active area formation allows for specific trench isolation depths to be retained by providing the space needed to etch the isolation areas deep and uniform, between active areas, as design rules shrink.

According to example embodiments, an opening to the isolation trenches between silicon pillars are filled with an isolation material to prevent a shallowing or narrowing of the trenches at a bottom portion of the trench prior to epitaxial deposition and growth. The isolation material is then recessed back to form an opening to a depth less than an overall depth of an isolation trench and re-open an area between a top region to silicon pillars prior to deposition of the amorphous starting layer, e.g., enhancer layer, which is then used to enlarge the active areas.

Previously, the epitaxial growth process to grow a thin crystalline film over the silicon and substrate and within the trench would increase a V-shape height in the silicon material at the bottom portion of the trench and could "pinch off" or at least reduce a straight profile of walls to the isolation trench. For example, such reduction in the straight profile of the walls along the bottom of the opening may result in a reduction in the depth of the opening, i.e., "shallowing" of the opening. Such shallowing of the opening may reduce an effectiveness of isolation between neighboring active areas to discrete devices as design scale shrinks to smaller dimensions.

The present disclosure includes methods, apparatuses, and systems related to reduction of shallowing of an opening or trench formed in a silicate material during shaping and enhancing of an active area of a semiconductor device. An example method includes forming a silicon (Si) material on a semiconductor substrate and removing a portion of the Si material to form pillars within the Si material, the pillars having inner sidewalls forming an opening having a first depth within the Si material. The example method further includes depositing an isolation material within the opening to fill the opening between the pillars and removing a portion of the isolation material from between the pillars to reduce the first depth of the opening to a second depth of the opening defined by the inner sidewalls between the pillars. An enhancer material is then deposited over a top surface of the pillars and along the inner sidewalls of the pillars to a top portion of the isolation material.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, "a number of" something can refer to one or more such things. For example, a number of capacitors can refer to at least one capacitor.

The figures herein follow a numbering convention in which the first digit or digits correspond to the figure number of the drawing and the remaining digits identify an element or component in the drawing. Similar elements or components between different figures may be identified by the use of similar digits. For example, reference numeral 106 may reference element "106" in FIG. 1, and a similar element may be referenced as 506 in FIG. 5.

Figure 1:
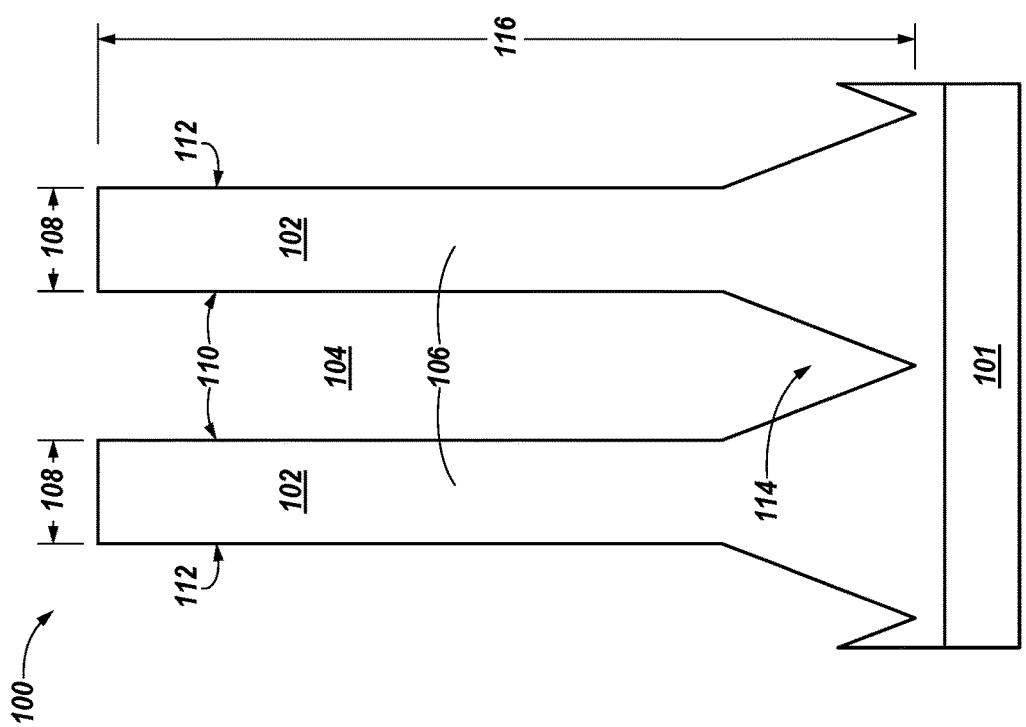

FIG. 1 illustrates a cross-sectional view of a portion of an example semiconductor structure at a point 100 in time in an example semiconductor fabrication sequence for reduction of shallowing in a silicate material during shaping and enhancing of an active area of a semiconductor device in accordance with a number of embodiments of the present disclosure. The fabrication sequence illustrated in FIG. 1 is shown at a point 100 in time that corresponds to various processing activities already having been performed in the fabrication sequence.

During a fabrication sequence, an opening 104 may be formed through one or more semiconductor materials 102, e.g., silicon (Si) or compounds thereof, over a substrate 101 to form pillars 106, e.g., silicon composed pillars, that may serve as active areas to discrete semiconductor device regions, e.g., source regions, drain regions, channel regions, etc. As shown in FIG. 1, the opening 104 may be formed to have a first depth 116, according to a particular design rule or process scale, and create inner sidewalls 110 to neighboring silicon pillars 106. In one example, the first depth 116 can be between 100 nm to 300 nm. Forming an opening through the one or more semiconductor materials 102, e.g., Si or compounds thereof, may be accomplished by patterning and etching according to photolithographic techniques. The silicon pillars 106 may thus be formed to have a particular width 108 according to a given design rule.

The substrate material 101 may be formed from various undoped or doped materials on which memory device materials may be fabricated. Examples of a relatively inert undoped substrate material 101 may include monocrystalline silicon (monosilicon), polycrystalline silicon (polysilicon), and amorphous silicon, among other possibilities.

In one example, the isolation material 220 may be formed from silicon oxide (SiO). Other examples of the isolation material 220 may include silicon nitride (SiN), aluminum oxide (AlOx), or spin-filled silicon oxide. Using a selected etching process (shown in FIG. 3), portions of the isolation material 220 may be removed.

As illustrated in FIG. 1, when the opening 104 is formed within the silicon material 102 at smaller dimensions and with an increased depth, a tapering or reduction in the straight profile of the inner sidewalls 110 of the pillars 106 may occur along a bottom portion 114 of the opening 104 formed in the silicon material 102. Such tapering along the bottom portion 114 of the opening 104 may result in a reduction in the depth of the opening 104, i.e., "shallowing" of the opening 104. Such shallowing of the opening 104 may reduce a capacitance of the device and cause an increase in a probability of a short circuit fault occurring during subsequent use of a resulting capacitor on a memory device.

In addition to forming the opening 104 to have an increased depth, an increased active layer of the substrate may also be desired, which is accomplished using an epitaxial growth process to grow a thin crystalline or enhancer layer positioned over the substrate forming the opening 104. Therefore, the present disclosure relates to methods, apparatuses, and systems related to reduction of shallowing of an opening or trench formed in a silicate material during shaping and enhancing of an active area of a semiconductor device.

FIG. 2 is a cross-sectional view of a portion of an example semiconductor structure during a next sequence of processing steps according to embodiments of the present disclosure. As illustrated in FIG. 2, in order to reduce the effects of shallowing when forming an opening 204 in an Si material 202, an isolation material 220 may be deposited over the silicon pillars 206 and within the opening 204 formed in the isolation material 220 to fill the opening 204 above a top portion 224 of the pillars 206 and cover outer sidewalls 212 of the pillars. For example, the isolation material 220 may initially be deposited to have a predetermined height 222 so that the isolation material 220 is positioned over top portions 224 of the pillars 206 to be a predetermined height above the top portions 224. In one example, the predetermined height 222 can be between 100 nm to 300 nm. In one example, the predetermined height 222 can be greater than the first depth 116 described in association with FIG. 1.

In addition, the isolation material 220 may initially be deposited about the Si material 202 having a predetermined width 226 so that the isolation material 220 extends along outer sidewalls 212 of the pillars 206 from the top portion 222 of the pillars 206 to the substrate material 201, and within the opening 204 so as to extend along the inner sidewalls 210 of the pillars 206 forming the opening 204 from the top portion 222 of the pillars 206 to a bottom portion 214 of the opening 204. As a result, the isolation material 220 extends within tapering formed by the inner sidewalls 210 along the bottom portion 214 of the opening 204 that results in shallowing of the opening 204.

In one example, the isolation material 220 may be formed from silicon oxide (SiO). Other examples of the isolation material 220 may include silicon nitride (SiN), aluminum oxide (AlOx), or spin-filled silicon oxide. Using a selected etching process, portions of the isolation material 220 may be removed (shown in FIG. 3).

Figure 3:
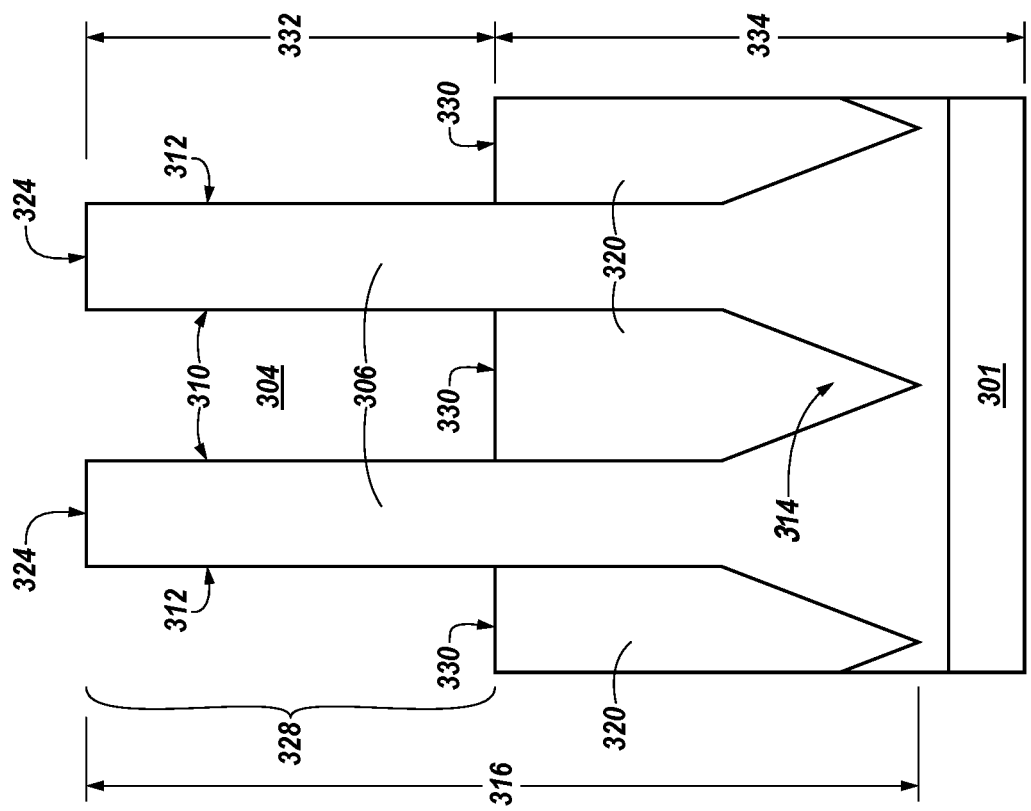

FIG. 3 is a cross-sectional view of a portion of an example semiconductor structure during a next sequence of processing steps according to embodiments of the present disclosure. As illustrated in FIG. 3, once the opening 304 has been filled with isolation material 320, a portion of the isolation material 320 is removed to a second depth 332 less than a first depth 316 of the isolation trench opening 304 initially formed by the opening 304 to re-open areas and sidewalls 310 between the silicon pillars 306 that will serve as active areas. In one example, the second depth can be between approximately 10%-70% of the original depth (e.g., first depth 116 in FIG. 1) of the isolation material 320. According to example embodiments, a portion of the isolation material 320 may be removed using selective oxide etching chemistries. By way of example the selective oxide etching chemistries may include: a fluorine based vapor and/or plasma etch (e.g., using gases like $NF_3$, HF, $NF_3/NH_3$/Ar); SiConi™ clean; a BOE (buffered oxide etch) with surfactant for roughness and uniformity improvement; a dilute HF etch, etch. Thus, portions of the isolation material 320 may be removed to form a top portion 330 of the isolation material 320 that is positioned a predetermined distance 332 below top portions 324 of the silicon pillars 306.

As a result, portions of the isolation material 320 may be subsequently removed so as to form a remaining portion of the isolation material 320 that has a predetermined subsequent isolation height 334 along the silicon pillars 306. For example, a portion of the isolation material 320 may be removed so that the isolation material 320 is positioned within the opening 304 to extend along inner sidewalls 310 of the pillars 306 from the top portion 330 of the isolation material 320 positioned the distance 332 below the top portion 324 of the pillars 306 to a bottom portion 314 of the opening 304, therefore within a portion of the opening 304 where tapering is formed by the inner sidewalls 310 along the bottom portion 314 of the opening 304 that may result in shallowing of the opening 304.

In this way, the isolation material 320 is removed so that the isolation material 320 is no longer positioned along the inner sidewalls 310 and the outer sidewalls 312 along a portion of the pillars 306 to form an exposed area 328 of the pillars 306 extending the predetermined distance 332 from the top portions 324 of the pillars 306 to the top portion 330 of the isolation material 320

Figure 4:
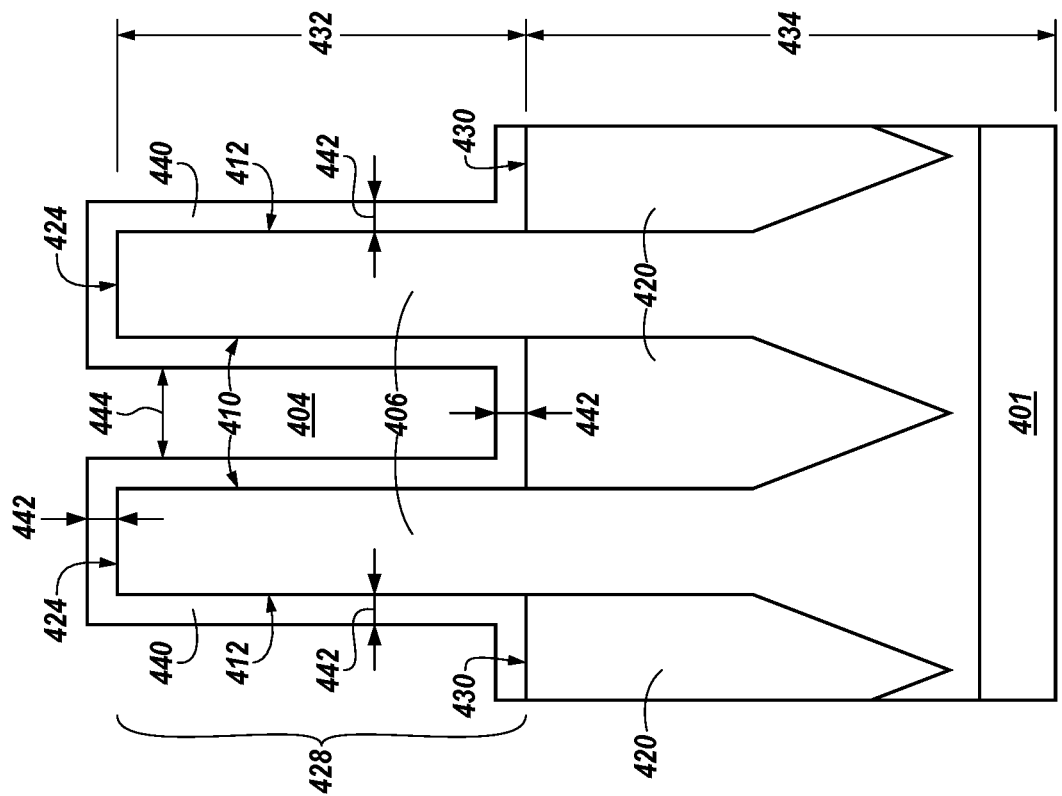

FIG. 4 is a cross-sectional view of a portion of an example semiconductor structure during a next sequence of processing steps according to embodiments of the present disclosure. As illustrated in FIG. 4, an amorphous enhancer material 440, e.g., starting film, may be deposited over a top surface of the pillars 406 and along the inner sidewalls 410 down to a top portion 430 of the isolation material 420 to be positioned along the exposed area 428 of the pillars 406 within the opening 404 of the silicon pillars 406. For example, as illustrated in FIG. 4, the enhancer material 440 may be positioned to have a predetermined width 442 less than one half of a width 444 between the inner sidewalls 410 of the pillars 406. The predetermined width 442 can be between approximately 1-4 nm in thickness, added per side and may be dependent on the space allowed. The width 442 may be chosen based on the dimensions of the desired active area of the pillars 406. The enhancer material 440 is positioned along the pillars 406 to extend the width 442 above top portions 424 of the pillars 406, and outward the width 443 from the outer sidewalls 412 of the pillars and the inner sidewalls of the pillars 410. In addition, the enhancer material 440 may be formed so as to be positioned along the top portion 430 of the isolation material 420 to extend the width 442 above the isolation material 420 between the inner walls 410 of the pillars.

Examples of enhancer materials include amorphous Si (<500 C), amorphous Ge (<400 C), amorphous SiGe (</=430 C, </=80% Ge), amorphous Boron-doped SiGe (</=400 C, <80% GE), Phosphorous-doped a-Si, Arsenic-doped a-Si, and Indium-doped a-Si. Any Group II or Group V semiconductor could also be used an enhancer film in doping with Si or Ge chemistries could be utilized. Incorporation of the enhancer material may also come from subsequent isolation deposition with a temperature above amorphous-crystalline transition to re-fill the top portion of the opening, or through a low or high temperature solid phase epitaxial growth.

Figure 5:
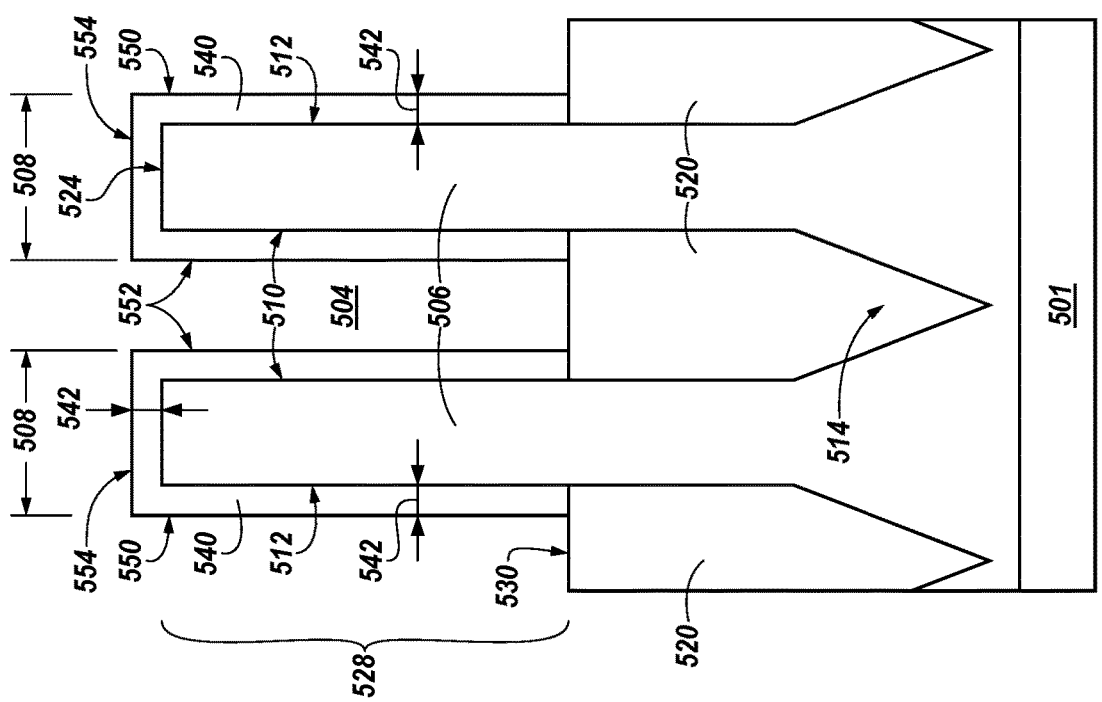

FIG. 5 is a schematic diagram of an example structure associated with forming of an enhancer material during fabrication in accordance with a number of embodiments of the present disclosure. As illustrated in FIG. 5, once portions of an isolation material 520 have been subsequently removed and an enhancer material 540 having a predetermined width 542 is positioned along portions of pillars 506, as described above in reference to FIG. 4, singulation of the enhancer material 540 may be performed by removing portions of the enhancer material 540 to electrically isolate the silicon pillars 506.

For example, as illustrated in FIG. 5, a portion of the enhancer material 540 that extends between inner sidewalls 552 of the enhancer material 540 along the top portion 530 of the isolation material 520 within the opening 504 may be removed. As a result, the inner sidewalls 552 of the enhancer material 540 within the opening 504 are formed to have a straight profile within the opening 504 from a top portion 554 of the enhancer material 540 extending above top portions 524 of the pillars 506 to the top portion 530 of the isolation material 520.

In addition, a portion of the enhancer material 540 along the top portion 530 of the isolation material 520 that extends between outer sidewalls 550 of the enhancer material 540, positioned along the outer sidewalls 512 of the pillars 506. As a result, the outer sidewalls 550 of the enhancer material 540 are formed to have a straight profile over the exposed area 528 of the pillars 506 from a top portion 554 of the enhancer material 540 extending above top portions 524 of the pillars 506 to the top portion 530 of the isolation material 520.

In this way, removing the enhancer material 540 along the top portion 530 of the isolation material 520 that extends between inner sidewalls 552 of the enhancer material 540 within the opening 504 formed by the pillars 506, along the top portion 530 of the isolation material 520 extending between the outer sides 552 of the enhancer material 540 positioned along the outer sidewalls 512 of the pillars 506, results in electrical isolation of the pillars 506.

Figure 6:
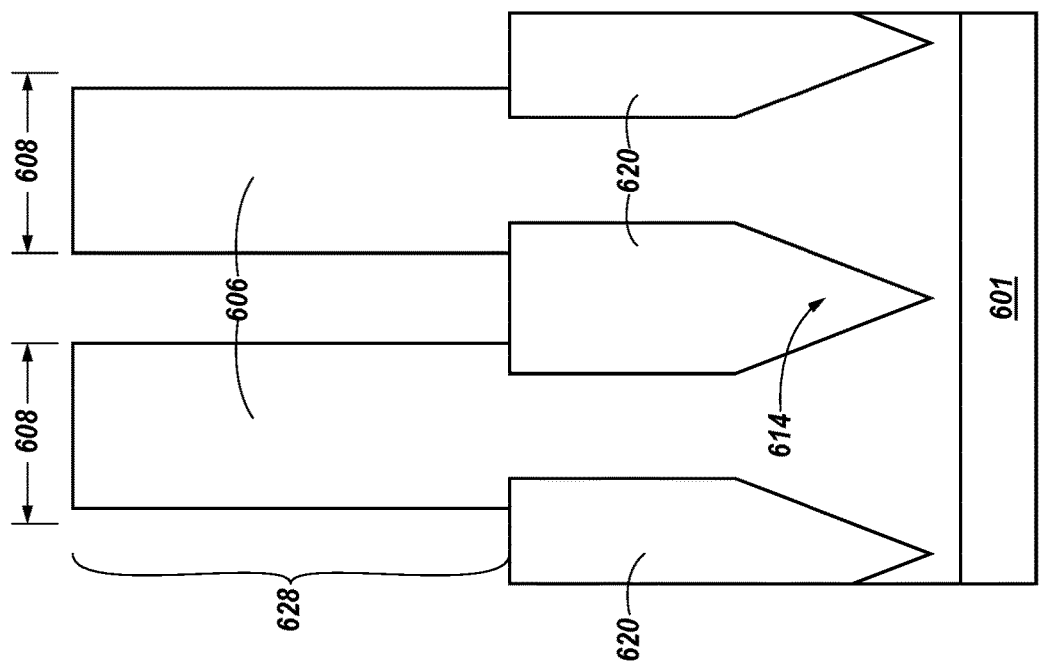

FIG. 6 is a schematic diagram of an example semiconductor structure associated with forming of an enhancer material in accordance with a number of embodiments of the present disclosure. As illustrated in FIG. 6, once portions of the enhancer material (e.g., 540 in FIG. 5) are removed to electrically isolate the pillars 606, epitaxial growth of the silicon pillars 606 occurs along the exposed area 628 of the pillars. As a result, the width 608 of the pillars 606 is increased, as illustrated in FIG. 6, thereby increasing the active area associated with the exposed area 628 of the pillars 606.

Therefore, by forming the isolation material 620 about the silicon pillars 606 and positioning the enhancer material (e.g., enhancer material 540) along the exposed area 628 of the pillars 606), as described above, the effects of shallowing of a bottom portion 614 of the opening 604 are reduced and the active area 528 of the pillars 506 is increased.

Figure 7:
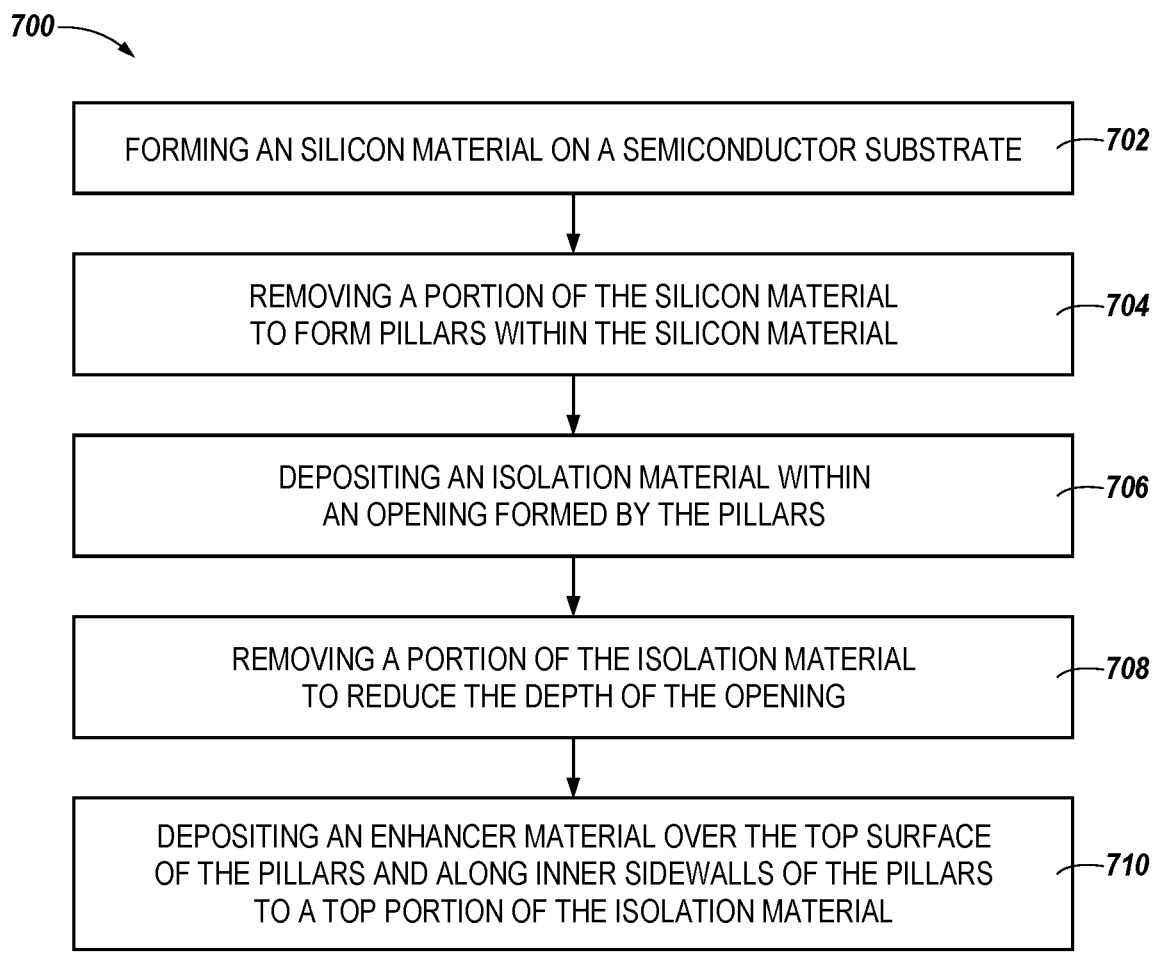
FIG. 7 is a flow diagram of example methods for formation of a semiconductor structure in accordance with a number of embodiments of the present disclosure.

FIG. 7 is a flowchart of an example method 700 for reduction of the effects of shallowing of an opening formed in a silicon material in accordance with a number of embodiments of the present disclosure. Unless explicitly stated, elements of methods described herein are not constrained to a particular order or sequence. Additionally, a number of the method embodiments, or elements thereof, described herein may be performed at the same time, or at substantially the same point in time.

At block 702, the method 700 may include forming a silicon (Si) material on a semiconductor substrate. At block 704, a portion of the Si material may be removed using an etching process to form pillars within the Si material, with the pillars having inner sidewalls forming an opening having a first depth within the isolation material.

At block, 706 an isolation material may be deposited within the opening to fill the opening between the pillars. The isolation material may, in a number of embodiments, be formed from silicon oxide (SiO). Other examples of the isolation material 220 may include silicon nitride (SiN), aluminum oxide (AlOx), or spin-filled silicon oxide.

The isolation material may initially be deposited about the Si material having an initial height so that a top portion of the isolation material is positioned over top portions of the pillars, extends along outer sidewalls of the pillars from the top portion of the isolation material to the substrate material, and extends within the opening between the pillars along the inner sidewalls of the pillars from the top portion of the isolation material to a bottom portion of the opening.

At block 708, a portion of the isolation material may be removed from between the pillars to reduce the first depth of the opening to a second depth of the opening defined by the inner sidewalls between the pillars. In this way, the isolation material may be subsequently removed about the Si material to have a subsequent height less than the initial height to form an exposed area of the pillars extending a predetermined distance from the top portions of the pillars to the top portion of the isolation material.

At block 710, an enhancer material may be deposited over a top surface of the pillars and along the inner sidewalls of the pillars to a top portion of the isolation material. The enhancer material may be one of amorphous silicon, amorphous geranium, amorphous silicon geranium, amorphous boron-doped silicon geranium, phosphorous-doped a-silicon, arsenic-doped a-silicon, and indium-doped a-silicon. In this way, the enhancer material may be positioned along the exposed area of the pillars. In one example, the enhancer material may be formed to have a predetermined width less than one half of a width extending between the inner sidewalls of the pillars.

In another example, the enhancer material may be formed to be positioned along the top portion of the isolation material and to extend above the isolation material between the inner walls of the pillars, and between the outer sidewalls of the pillars and outer sidewalls of the isolation material. In yet another example, a first portion of the enhancer material along a top portion of the isolation material extending between outer sidewalls of the enhancer material positioned within the opening along the inner sidewalls of the pillars may be removed, and a second portion of the enhancer material along the top portion of the isolation material extending between the outer sidewalls of the enhancer material positioned along outer sidewalls of the pillars and the outer sidewalls of the isolation material. In one example, the isolation material may be silicon oxide. Other examples of the isolation material may include silicon nitride (SiN), aluminum oxide (AlOx), or spin-filled silicon oxide.

Figure 8:
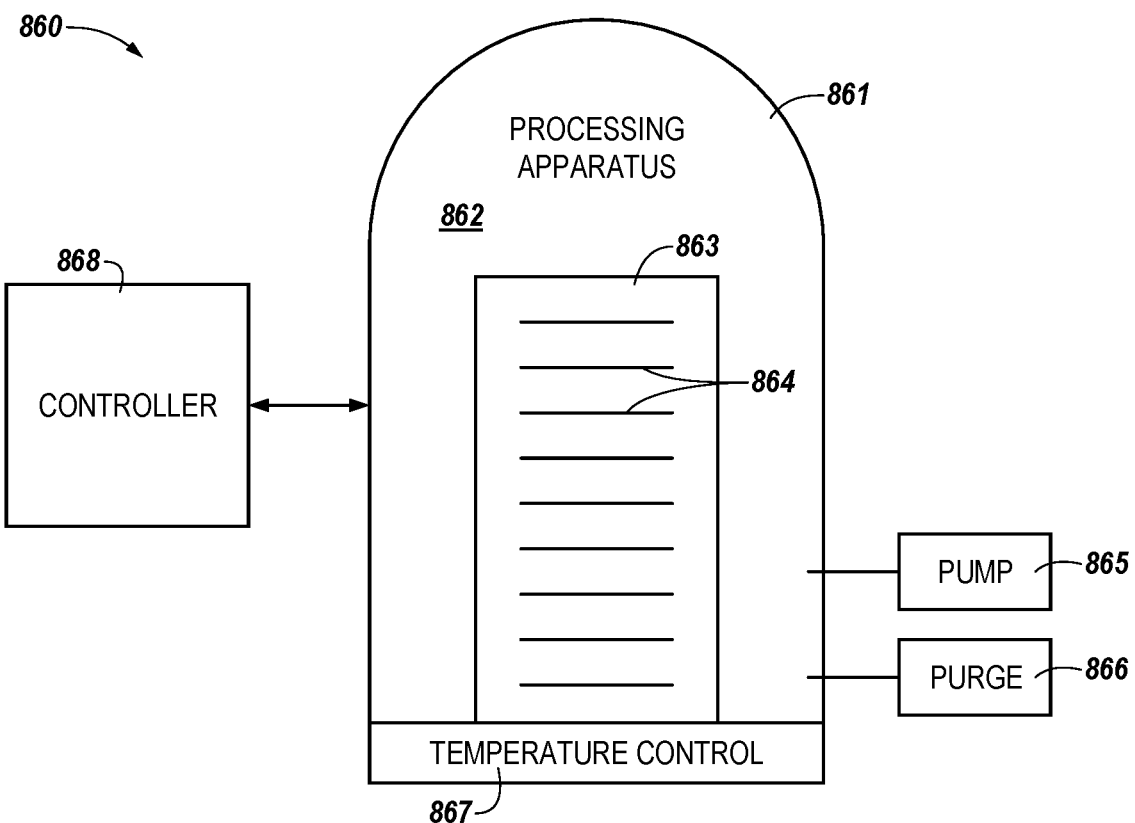
FIG. 8 is a functional block diagram of a system 760 for implementation of an example semiconductor fabrication process in accordance with a number of embodiments of the present disclosure.

FIG. 8 is a functional block diagram of a system 860 for implementation of an example semiconductor fabrication process in accordance with a number of embodiments of the present disclosure. The system 860 can include a processing apparatus 861. The processing apparatus 861 can be configured to enable formation of a semiconductor recess.

The processing apparatus 861 can include a semiconductor processing chamber 862 to enclose components configured to form a semiconductor recess. The chamber 862 can further enclose a carrier 863 to hold a batch of semiconductor wafers 864 (e.g., the substrate material 101). The processing apparatus 861 can include and/or be associated with tools including, for example, a pump 865 unit and a purge 866 unit configured to introduce and remove reducing agents. The processing apparatus 861 can further include a temperature control 867 unit configured to maintain the chamber 862 at appropriate temperatures as described herein.

The system 860 can further include a controller 868. The controller 868 can include, or be associated with, circuitry and/or programming for implementation of, for instance, formation of the semiconductor recess. Adjustment of such deposition and purging operations by the controller 868 can control the thickness of the materials described herein (the first silicate material, the metal, the second silicate material).

The controller 868 can, in a number of embodiments, be configured to use hardware as control circuitry. Such control circuitry may, for example, be an application specific integrated circuit (ASIC) with logic to control fabrication steps, via associated deposition and purge processes, for formation of a semiconductor recess.

Figure 9:
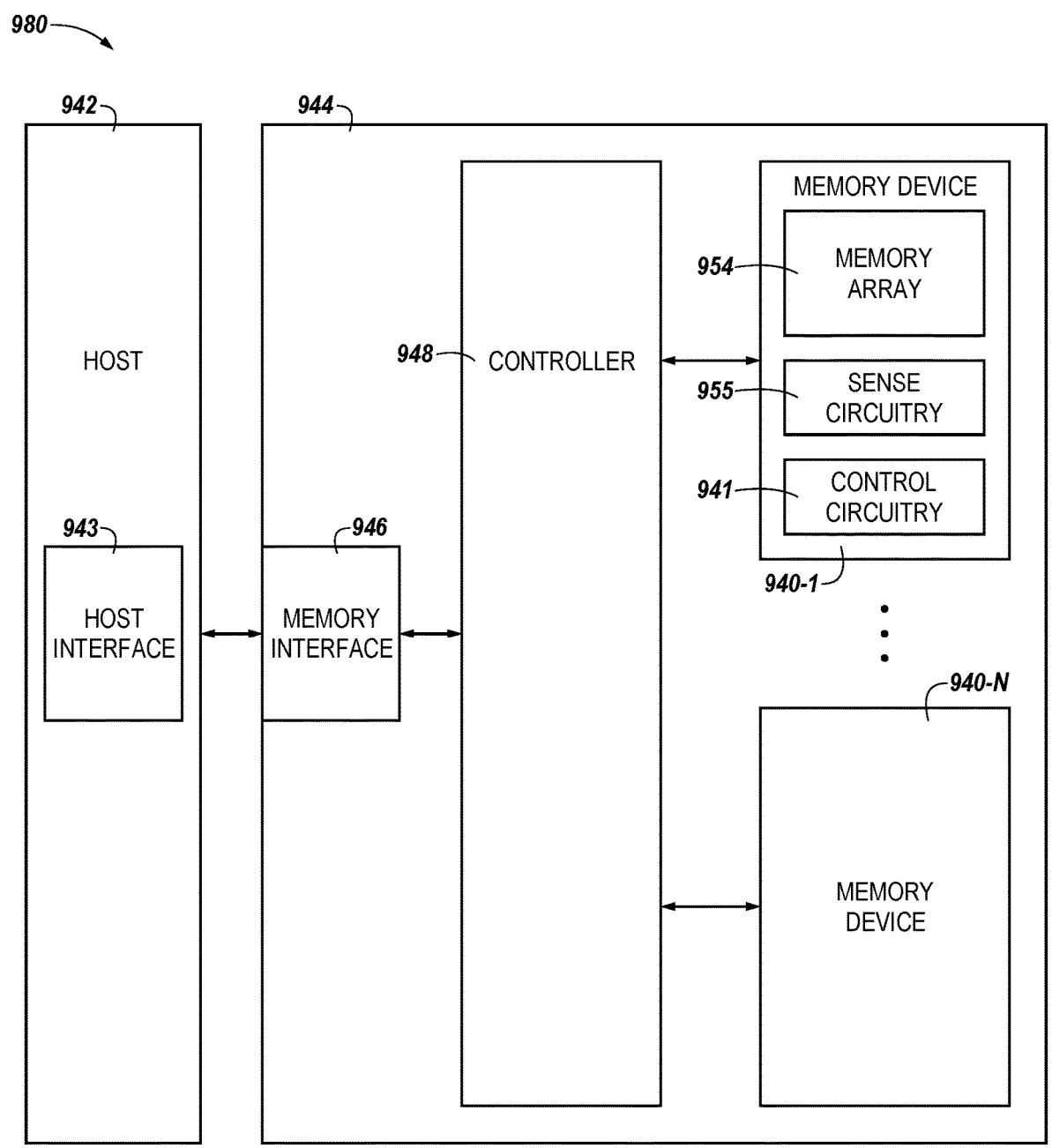
FIG. 9 is a functional block diagram of a computing system 880 including at least one memory array having a structure formed in accordance with one or more examples of the present disclosure.

FIG. 9 is a functional block diagram of a computing system 980 including at least one memory array having a structure formed in accordance with one or more examples of the present disclosure. The system 944 may be, for example, a solid-state drive (SSD).

In the example illustrated in FIG. 9, the system 944 includes a memory interface 946, a number of memory devices 940-1, . . . , 940-N, and a controller 948 selectably coupled to the memory interface 946 and memory devices 940-1, . . . , 940-N. Memory interface 946 may be used to communicate information between the system 944 and another device, such as a host 942. Host 942 may include a processor (not shown). As used herein, "a processor" may be a number of processors, such as a parallel processing system, a number of coprocessors, etc. Example hosts may include, or by implemented in, laptop computers, personal computers, digital cameras, digital recording devices and playback devices, mobile telephones, PDAs, memory card readers, interface hubs, and the like. Such a host 942 may be associated with fabrication operations performed on semiconductor devices and/or SSDs using, for example, a processing.

In a number of examples, host 942 may be associated with (e.g., include or be coupled to) a host interface 943. The host interface 943 may enable input of scaled preferences (e.g., in numerically and/or structurally defined gradients) to define, for example, critical dimensions (CDs) of a final structure or intermediary structures of a memory device (e.g., as shown at 940) and/or an array of memory cells (e.g., as shown at 954) formed thereon to be implemented by the processing apparatus. The scaled preferences may be provided to the host interface 943 via input of a number of preferences stored by the host 942, input of preferences from another storage system (not shown), and/or input of preferences by a user (e.g., a human operator).

Memory interface 946 may be in the form of a standardized physical interface. For example, when the system 944 is used for information (e.g., data) storage in computing system 980, memory interface 946 may be a serial advanced technology attachment (SATA) interface, a peripheral component interconnect express (PCIe) interface, or a universal serial bus (USB) interface, among other physical connectors and/or interfaces. In general, however, memory interface 906 may provide an interface for passing control, address, information, scaled preferences, and/or other signals between the controller 948 of the system 944 and a host 942 (e.g., via host interface 943).

Controller 948 may include, for example, firmware and/or control circuitry (e.g., hardware). Controller 948 may be operably coupled to and/or included on the same physical device (e.g., a die) as one or more of the memory devices 940-1, . . . , 940-N. For example, controller 948 may be, or may include, an ASIC as hardware operably coupled to circuitry (e.g., a printed circuit board) including memory interface 946 and memory devices 940-1, . . . , 940-N. Alternatively, controller 948 may be included on a separate physical device that is communicatively coupled to the physical device (e.g., the die) that includes one or more of the memory devices 940-1, . . . , 940-N.

Controller 948 may communicate with memory devices 940-1, . . . , 940-N to direct operations to sense (e.g., read), program (e.g., write), and/or erase information, among other functions and/or operations for management of memory cells. Controller 948 may have circuitry that may include a number of integrated circuits and/or discrete components. In a number of examples, the circuitry in controller 948 may include control circuitry for controlling access across memory devices 940-1, . . . , 940-N and/or circuitry for providing a translation layer between host 942 and the system 944.

Memory devices 940-1, . . . , 940-N may include, for example, a number of memory arrays 954 (e.g., arrays of volatile and/or non-volatile memory cells). For instance, memory devices 940-1, . . . , 940-N may include arrays of memory cells, such as a portion of an example memory device 970 structured to include structures described in connection with FIG. 10. As will be appreciated, the memory cells in the memory arrays 954 of memory devices 940-1, . . . , 940-N and/or as shown at 970 may be in a RAM architecture (e.g., DRAM, SRAM, SDRAM, FeRAM, MRAM, ReRAM, etc.), a flash architecture (e.g., NAND, NOR, etc.), a three-dimensional (3D) RAM and/or flash memory cell architecture, or some other memory array architecture including pillars and adjacent trenches.

Memory devices 940, 970 may be formed on the same die. A memory device (e.g., memory device 940-1) may include one or more arrays 954 of memory cells formed on the die. A memory device may include sense circuitry 955 and control circuitry 941 associated with one or more arrays 954 formed on the die, or portions thereof. The sense circuitry 955 may be utilized to determine (sense) a particular data value (e.g., 0 or 1) that is stored at a particular memory cell in a row of an array 954. The control circuitry 941 may be utilized to direct the sense circuitry 955 to sense particular data values, in addition to directing storage, erasure, etc., of data values in response to a command from host 942 and/or host interface 943. The command may be sent directly to the control circuitry 941 via the memory interface 946 or to the control circuitry 941 via the controller 948.

The example illustrated in FIG. 9 may include additional circuitry that is not illustrated so as not to obscure examples of the present disclosure. For example, memory devices 940, 970 may include address circuitry to latch address signals provided over I/O connectors through I/O circuitry. Address signals may be received and decoded by a row decoder and a column decoder to access a memory array 954. It will be appreciated that the number of address input connectors may depend on the density and/or architecture of memory devices 940, 970 and/or memory arrays 954.

Figure 10:
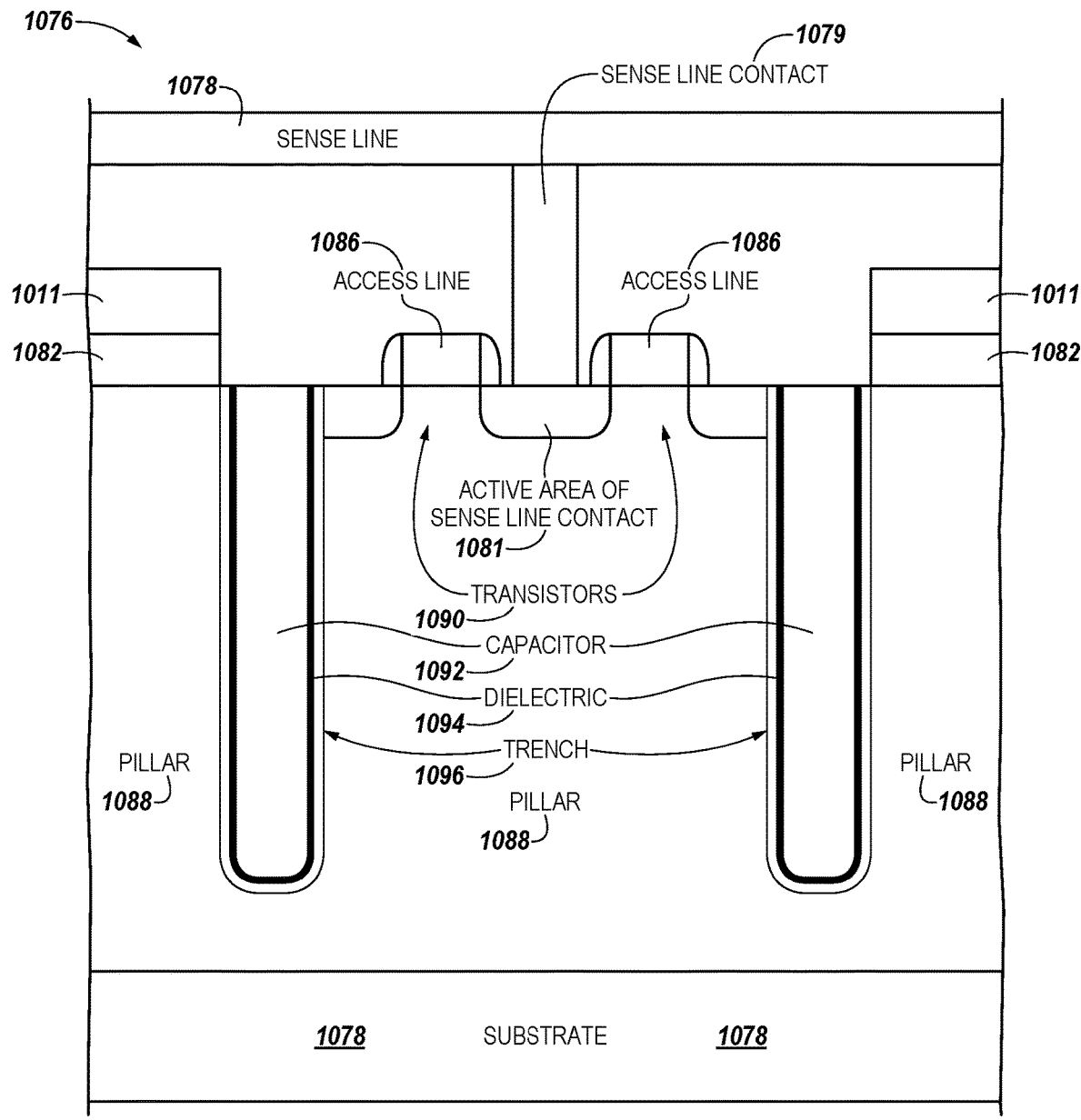
FIG. 10 illustrates a cross-sectional view of a portion of an example of semiconductor structures of a memory device 976 that include a structure formed in accordance with a number of embodiments of the present disclosure.

FIG. 10 illustrates a cross-sectional view of a portion of an example of semiconductor structures of a memory device 1076 that include a structure formed in accordance with a number of embodiments of the present disclosure. The portion of the memory device 1076 illustrated in FIG. 10 is shown by way of example and not by way of limitation to include a DRAM memory cell architecture. Another RAM, flash (e.g., NAND or NOR), and/or 3D memory cell architecture also may include pillars and adjacent trenches. Embodiments are not so limited. Although the DRAM transistors 1090 and capacitors 1092 are shown to be arranged in a lateral configuration, embodiments may include the transistors 1090 and capacitors 1092 being arranged in a lateral, a vertical, or any other configuration.

The portion of the memory device 1076 shown in FIG. 10 may represent two DRAM memory cells in a 1T1C (one transistor one capacitor) configuration or one DRAM memory cell in a 2T2C configuration. DRAM memory cells may utilize capacitors 1092 each formed in a trench 1096 to store a particular charge corresponding to a data value. Forming the trenches 996 as shown in FIG. 10 may result in a pillar 1088 being formed from the etched material on each side of a trench 1096. Pillars 1088 may be formed (e.g., fabricated) as layers of doped or undoped semiconductor material deposited on a substrate material 1078. The semiconductor material may be etched to form the pillars 1088 and trenches 1096. In some embodiments, an opening (e.g., a round, square, oblong, etc., opening rather than a rectilinear trench) may be etched into the semiconductor material and capacitor material may be deposited in the opening, although such a configuration does not affect the concept of passivation material for pillars adjacent a trench.

Moreover, embodiments of the present disclosure are not limited to capacitors being formed in a trench for data storage, nor are embodiments limited to the trench containing capacitor material. For example, various types of memory devices may include trenches between sidewall structures (e.g., pillars) in which various materials may be positioned to contribute to data access, storage, and/or processing or in which various materials may be formed for electrical conduction and/or isolation (e.g., conductor, resistor, and/or dielectric materials), among other functions and/or operations.

In a number of embodiments, a trench 1096 may be etched to a particular depth into a pillar material. The trench 10 may be etched into the material of the pillars 1088 to a depth approaching the substrate material 1098, as shown in FIG. 10. Alternatively, the trench 1096 may be etched into the material of the pillars 1088 to a top of or into the substrate material 1098. The depth of the trench 1096 approaching, at the top of, and/or into the substrate material 1098 is termed herein as being in the bottom region of the trench.

As described herein, deepening (e.g., etching) the trench further into the pillar material or the substrate material, formed according to embodiments described in FIGS. 1-8, may increase a surface area of the trench boundaries. In one example, increasing the surface area of the trench boundaries may increase a capacitance of a capacitor 1092 formed in the trench 1096 (e.g., by increasing a volume and/or surface area of the capacitor). In this example, the trench 1096 may be lined with a dielectric material 1094 and a capacitor material may be formed (e.g., deposited) within the trench 1096 and on the dielectric material 1094 to form the capacitor 1092 to a particular (e.g., target) depth.

Each pillar 1088 of the pillar material may extend to a particular height above the substrate material 1098. As such, each pillar 1088 has a top surface 1026 at the particular height. A number of structural materials may be formed on or in association with the top surface 1026 of the pillar 1088 adjacent the trench 1096. For example, a particular material 1082 may be formed to contribute to data access, storage, and/or processing (e.g., conductor, resistor, and/or dielectric materials). Such a material 1082 may be formed on the top surface 1026 of the pillar 1088 adjacent the trench 1096. A mask material 1011 may be formed to protect an underlying material 1082 and/or the top surface 1026 of the pillar 1088 adjacent the trench 1096 from subsequent processing and/or wear encountered in use of the memory device 1076. Other structural materials that may be formed (e.g., in a DRAM configuration as shown in FIG. 10) on or in association with the top surface 1026 of the pillar 1088 adjacent the trench 1096. The other structural materials may include the transistors 1090, access lines 1086, and/or sense lines 1078, among other possible structural materials. The structural materials just described as being formed on and/or in association with the top surface 1026 of the pillar 1088 adjacent the trench 1096 are termed herein as being in a top region of the pillar 1088 and/or trench 1096.

Formation of the capacitors and a capacitor support structure as just described may enable each of the capacitors to be maintained in a static configuration (e.g., relative to each other and the underlying material). For example, the capacitor support structure may reduce (e.g., prevent) a possibility of shallowing occurring in an opening formed within the isolation material. The reduction of the shallowing of the capacitors may reduce a possibility of unintended consequences, such as operational failure or leakage of the semiconductor device, need to replace parts, etc, and may enhance the speed of the device.

Formation of the capacitors and capacitor support structure as just described may be utilized in fabrication of a memory device that includes at least one memory cell. Such a memory cell may include at least one such capacitor, as a data storage element, that is supported by the capacitor support structure. The memory cell also may include at least one access device (e.g., transistor) (not shown) that is, or may be, coupled to the at least one capacitor.

In the above detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

It is to be understood that the terminology used herein is for the purpose of describing particular embodiments only and is not intended to be limiting. As used herein, the singular forms "a", "an", and "the" include singular and plural referents, unless the context clearly dictates otherwise, as do "a number of", "at least one", and "one or more" (e.g., a number of memory arrays may refer to one or more memory arrays), whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically and, unless stated otherwise, can include a wireless connection for access to and/or for movement (transmission) of instructions (e.g., control signals, address signals, etc.) and data, as appropriate to the context.

While example embodiments including various combinations and configurations of semiconductor materials, underlying materials, structural materials, dielectric materials, capacitor materials, substrate materials, silicate materials, nitride materials, buffer materials, etch chemistries, etch processes, solvents, memory devices, memory cells, sidewalls of openings and/or trenches, among other materials and/or components related to reduction of tapering on a sidewall of an opening, have been illustrated and described herein, embodiments of the present disclosure are not limited to those combinations explicitly recited herein. Other combinations and configurations of the semiconductor materials, underlying materials, structural materials, dielectric materials, capacitor materials, substrate materials, silicate materials, nitride materials, buffer materials, etch chemistries, etch processes, solvents, memory devices, memory cells, sidewalls of openings and/or trenches related to reduction of tapering on a sidewall of an opening than those disclosed herein are expressly included within the scope of this disclosure.

Although specific embodiments have been illustrated and described herein, those of ordinary skill in the art will appreciate that an arrangement calculated to achieve the same results may be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
    forming a silicon (Si) material on a semiconductor substrate;
    forming an opening through the silicon (Si) material to a first depth to form pillars of the Si material;
    depositing an isolation material within the opening to fill the opening between the Si pillars;
    removing a portion of the isolation material from between the pillars to a second depth to create a second opening between the pillars and defining inner sidewalls between the pillars; and depositing an enhancer material over a top surface of the pillars and along the inner sidewalls of the pillars down to a top portion of the isolation material.

2. The method of claim 1, wherein the method further comprises:
   initially depositing the isolation material about the Si material having an initial height such that:
   the top portion of the isolation material is positioned over top portions of the pillars,
   the isolation material extends along outer sidewalls of the pillars from the top portion of the isolation material to the semiconductor substrate, and
   the isolation material extends within the opening between the pillars along the inner sidewalls of the pillars from the top portion of the isolation material to a bottom portion of the opening.

3. The method of claim 2, wherein the method further comprises:
   subsequently removing the isolation material about the Si material to have a subsequent height less than the initial height to form an exposed area of the pillars extending a predetermined distance from the top portions of the pillars to the top portion of the isolation material.

4. The method of claim 3, wherein the method further comprises depositing the enhancer material to be positioned along the exposed area of the pillars.

5. The method of claim 4, wherein the method further comprises depositing the enhancer material to have a predetermined width less than one half of a width extending between the inner sidewalls of the pillars.

6. The method of claim 5, wherein the method further comprises depositing the enhancer material to be positioned along the top portion of the isolation material and to extend above the isolation material between the inner sidewalls of the pillars, and between the outer sidewalls of the pillars and outer sidewalls of the isolation material.

7. The method of claim 6, wherein the method further comprises:
   removing a first portion of the enhancer material along a top portion of the isolation material extending between outer sidewalls of the enhancer material positioned within the opening along the inner sidewalls of the pillars; and
   removing a second portion of the enhancer material along the top portion of the isolation material extending between the outer sidewalls of the enhancer material positioned along outer sidewalls of the pillars and the outer sidewalls of the isolation material.

8. The method of claim 1, wherein the isolation material comprises silicon oxide.

9. The method of claim 1, wherein the enhancer material comprises one of amorphous silicon, amorphous geranium, amorphous silicon geranium, amorphous boron-doped silicon geranium, phosphorous-doped a-silicon, arsenic-doped a-silicon, and indium-doped a-silicon.

* * * * *